United States Patent [19]

Mozer et al.

[11] Patent Number: 4,839,901
[45] Date of Patent: Jun. 13, 1989

[54] SEMICONDUCTOR LASER WITH CONSTANT DIFFERENTIAL QUANTUM EFFICIENCY OR CONSTANT OPTICAL POWER OUTPUT

[75] Inventors: Albrecht Mozer; Kurt Lösch, both of Stuttgart, Fed. Rep. of Germany

[73] Assignee: Alcatel N.V., Amsterdam, Netherlands

[21] Appl. No.: 235,933

[22] Filed: Aug. 24, 1988

[30] Foreign Application Priority Data

Aug. 25, 1987 [DE] Fed. Rep. of Germany ....... 3728305

[51] Int. Cl.[4] ................................................ H01S 3/19
[52] U.S. Cl. .......................................... 372/49; 372/31
[58] Field of Search ............................ 372/49, 29, 31

[56] References Cited

U.S. PATENT DOCUMENTS 4,092,659  5/1978  Ettenberg .............................. 372/49

FOREIGN PATENT DOCUMENTS 2410559  9/1975  Fed. Rep. of Germany ........ 372/49

Primary Examiner—James W. Davie
Attorney, Agent, or Firm—Spencer & Frank

[57] ABSTRACT

A semiconductor laser is disclosed whose front or rear surface is provided with a multilayer dielectric and/or reflective coating in such a way that either a temperature-independent differential quantum efficiency or a temperature-independent power output is obtained. The sequence of layers is chosen so that the reflection coefficient decreases with increasing light wavelength. (In other laser systems, it may be necessary for the reflection coefficient to increase).

3 Claims, 2 Drawing Sheets

SEMICONDUCTOR LASER WITH CONSTANT DIFFERENTIAL QUANTUM EFFICIENCY OR CONSTANT OPTICAL POWER OUTPUT

BACKGROUND OF THE INVENTION

The present invention relates to a semiconductor laser with constant differential quantum efficiency or constant optical power output.

The differential quantum efficiency $\eta_{ext}$ and the optical power output $P_{opt}$ of a laser diode are strongly temperature-dependent. For many applications, however, either a nearly temperature-independent differential quantum efficiency $\eta_{ext}$ or a nearly temperature-independent power output $P_{opt}$ are desirable. In optical communication systems using intensity modulation, only a temperature-independent differential quantum efficiency makes it possible to convert a constant frequency swing of the control current into a constant modulation depth of the optical signal. If a laser diode is used as a transmitter which must have a constant light output, the output should be temperature-independent (at a constant injection current).

DE-OS No. 35 34 744 discloses a laser device with stabilized power output in which the current flowing through the laser diode is influenced by a temperature-dependent compensating resistor in such a way that the optical power emitted by the laser diode is largely independent of temperature. To accomplish this, it must be ensured that the temperature-dependent resistor and the laser diode have the same temperature.

The prior art device has the disadvantage that even small temperature differences between the laser diode and the compensating resistor result in large output-power variations, which is not sufficient for many applications.

BRIEF DESCRIPTION OF THE PRESENT INVENTION

It is, therefore, the object of the present invention to compensate temperature effects on the optical power output or the differential quantum efficiency of a semiconductor laser in an optimum fashion. This object is attained by providing a laser diode with front and rear ends comprised of multiple layers of semi-reflective material whose wavelength-dependent reflection coefficients are selected to achieve temperature independent differential quantum efficiency $\eta_{ext}$.

One advantage of the invention lies in the fact that, to stabilize the differential quantum efficiency or the optical power output of the laser diode, no intervention in the power supply to the laser diode is necessary. Further advantages of the invention follow from the features set forth below.

An embodiment of the invention - an InGaAsP/InP laser diode - will now be explained with reference to the accompanying drawings, in which.

Figure 1:
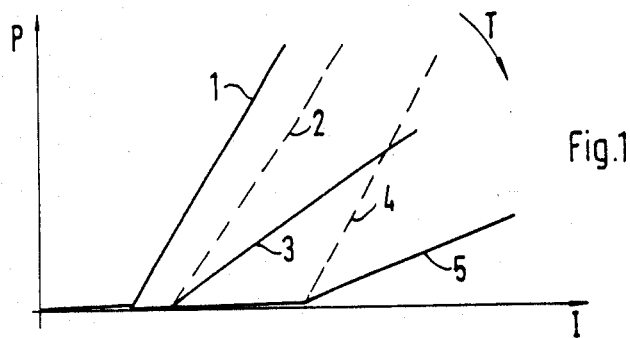
FIG. 1 shows the actual dependence of the optical power P on the control current I for different temperatures and the desired dependence for achieving a constant differential quantum efficiency.

The characteristics designated 1, 3, and 5 in FIG. 1 represent the dependence of the power output of a semiconductor laser diode on the control current I for different temperatures. The temperature increases from characteristic 1 to characteristic 5. The slopes of the characteristics - a measure of the differential quantum efficiency - decrease with increasing temperature. A temperature-independent differential quantum efficiency is obtained if the characteristics follow the dashed lines 2 and 4, which run parallel to characteristic 1. In the following it will be described how characteristics as indicated by the lines 2 and 4 can be achieved by optical methods.

Figure 2:
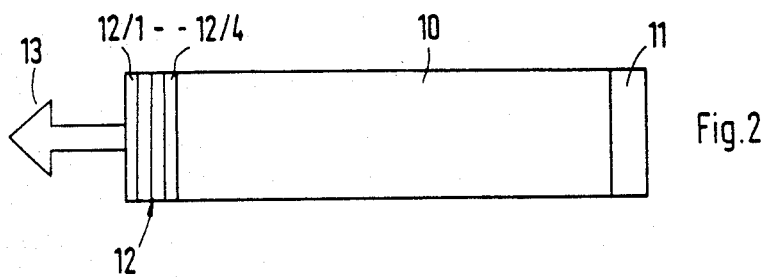
FIG. 2 is a schematic representation of a semiconductor laser with the dielectric and/or reflective coatings in accordance with the invention.

FIG. 2 is a schematic representation of a semiconductor laser. The laser diode is designated 10. 11 is a directional coating and/or a reflective coating on the rear surface of the diode, and 12 is a dielectric coating and/or a reflective coating on the front surface of the diode. The optical output power of the laser diode is coupled out at the front end; this is indicated by the arrow 13. The coating 12 consists of layers 12/1 to 12/4. Each of these layers has a different index of refraction. The indices of refraction of the individual layers are so chosen that a desired, predeterminable wavelength-dependent reflection coefficient is obtained. The reflection coefficient of the coating 12 will be designated $R_1$, and that of the coating 11 will be designated $R_2$. In other embodiments, the multilayer coating is the coating 11 instead of the coating 12, or both coatings 11 and 12 are multilayer coatings.

The wavelength emitted by a laser diode is dependent on the temperature of the laser diode. For the embodiment shown, $$\lambda(T) = \lambda(0°\text{ C.}) + 0.45(nm/°\text{C.})T(°\text{C.}) \quad (1)$$

By shifting the emission wavelength and by suitable choice of the variation of the reflection coefficient with the wavelength, it can be arranged that the reflection coefficient of the coating 12 at higher temperatures is smaller than that at lower temperatures. In other words, the reflection coefficient of the coating 12 decreases with increasing wavelength, so that with increasing wavelength, an increasing portion of the light power generated by the laser is coupled out of the laser. In this manner, a temperature-independent differential quantum efficiency as shown by the dashed characteristics 2 and 4 of FIG. 1 is obtained.

The necessary variation of the reflection coefficient is calculated as follows:

$$\eta_{ext} = \eta_{int} \frac{\ln \frac{1}{R_1 R_2}}{2L\,\alpha_{int} + \ln \frac{1}{R_1 R_2}} \quad (2)$$

The external differential quantum efficiency $\eta_{ext}$ is assumed to be constant. It is also assumed that the internal quantum efficiency $\eta_{int}$ is independent of temperature. This does not limit the generality of the invention.

$$\frac{1}{\frac{2L\,\alpha_{int}}{\ln\frac{1}{R_1R_2}} + 1} = \text{constant}$$

Hence, $$\frac{2L\,\alpha_{int}}{\ln\frac{1}{R_1R_2}} = \text{constant}$$

where:

$\eta_{ext}$ = external quantum efficiency
$\eta_{int}$ = internal quantum efficiency
L = length of the resonator
$\alpha_{int}$ = internal absorption coefficient The absorption coefficient $\alpha_{int}$ and its temperature dependence must be determined experimentally prior to the application of reflective coatings. If the absorption coefficient changes as a result of the application of reflective coatings, this must be determined by series of tests and taken into account.

In the case of an uncoated laser - i.e., a laser without the coatings 11 and 12 -, a value of about $(0.35)^2$ is obtained for the product of the two reflection coefficients $R_1R_2$ at a temperature of 0° C. if the laser is an InGaAsP/InP laser. With this value, $$(R_1R_2)_T = \exp\left(-2.1\,\frac{\alpha_{int}(T)}{\alpha_{int}(T = 0°\,C.)}\right) \quad (3)$$

Table I shows the experimentally determined values of the absorption coefficient, the products $R_1 \cdot R_2$, and the emission wavelengths for different temperatures. The products $R_1 \cdot R_2$ were calculated by Eq. (3).

TABLE I

| T(°C.) | $\alpha_{int}(T)/(1/\text{cm})$ (*) | $R_1R_2(T)(\%)$ () | $\lambda_{(T)}/(\text{nm})$ (*) |
|---|---|---|---|
| 0 | 51.7 | 12.2 | 1300 |
| 10 | 56.4 | 10.1 | 1304.5 |
| 20 | 61.5 | 8.2 | 1309.0 |
| 30 | 67.3 | 6.5 | 1313.5 |
| 40 | 74.0 | 4.95 | 1318 |
| 50 | 81.0 | 3.8 | 1322.5 |
| 60 | 88.0 | 2.8 | 1327 |
| 70 | 96.0 | 2 | 1331.5 |

Figure 3:
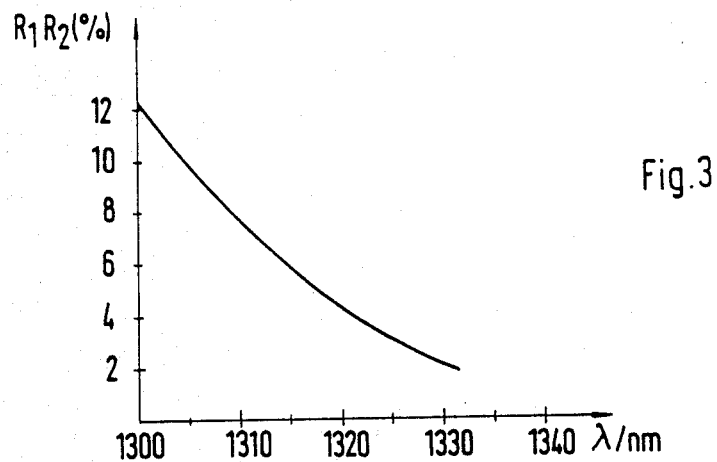
FIG. 3 is a plot of the product $R_1R_2$ versus wavelength for a temperature-independent quantum efficiency.

(*) calculated by Eq. (1)
(**) calculated by Eq. (3)
(***) determined experimentally prior to the application of the reflective coatings In FIG. 3, the product $R_1 \cdot R_2$ is plotted against the wavelength λ. This characteristic results in a temperature-independent quantum efficiency of 50.4%, referred to both laser mirrors, for a 200-μm-long laser. This spectral dependence of the reflection-coefficient product $R_1 \cdot R_2$ can be implemented with multilayer dielectric and/or reflective coatings.

Figure 4:
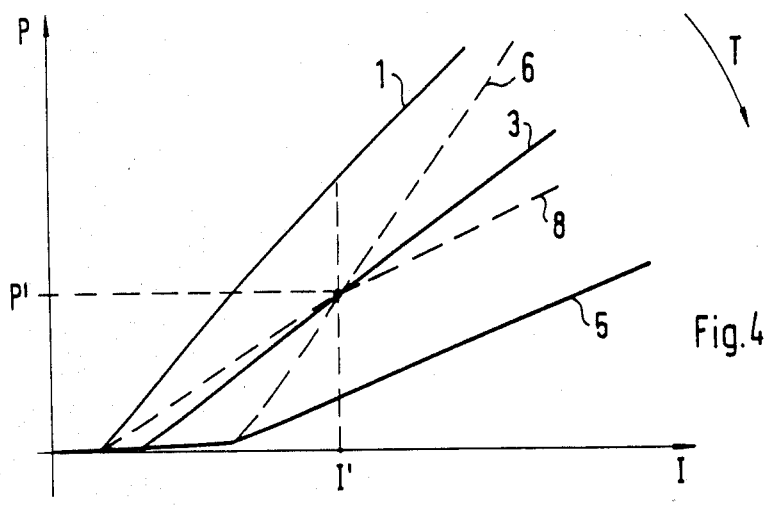
FIG. 4 shows the actual dependence of the optical power P on the control surrent for different temperatures and the desired dependence for generating a constant optical power output.

The layered structure of the coating 12 can also be used to produce a laser diode with temperature-independent optical power output. In FIG. 4, the characteristics showing the optical power output as a function of the control current for different temperatures are again designated 2, 3, and 5. Designated 3, 6, and 8 are characteristics which result in a constant power output P' at different temperatures if the control current I' is constant.

Table II shows the values of the product $R_1R_2$ which result in a temperature-independent optical power output. A power output of P' = 10 mW, an injection current of I' = 32 mA, and a laser length of L = 100 μm are assumed. $I_{th}$ is the minimum current required to initiate lasing action in the laser.

TABLE II

| T(°C.) | $I_{th}/(\text{mA})$ | $\eta_{ext}^{both\ laser}_{mirrors\ (\%)}$ | $R_1R_2(\%)$ (**) | $\lambda_{(T)}/(\text{nm})$ (*) |
|---|---|---|---|---|
| 0 | 5.2 | 37.2 | 54.2 | 1300 |
| 10 | 5.4 | 37.6 | 50.6 | 1304.5 |
| 20 | 5.75 | 38.1 | 46.9 | 1309 |
| 30 | 6.23 | 38.8 | 42.6 | 1313.5 |
| 40 | 6.8 | 39.7 | 37.8 | 1318 |
| 50 | 7.6 | 41 | 32.5 | 1322.5 |
| 60 | 8.58 | 42.7 | 26.9 | 1327 |
| 70 | 9.98 | 45.42 | 20.2 | 1331.5 |
| 80 | 12.8 | 52 | 9.56 | 1336 |

P' = 10 mW
I' = 32 mA
L = 100 μm
(*) calculated by Eq. (1)
(**) calculated by Eq. (3), with the values of Table I substituted for $\alpha_{int}$.

Figure 5:
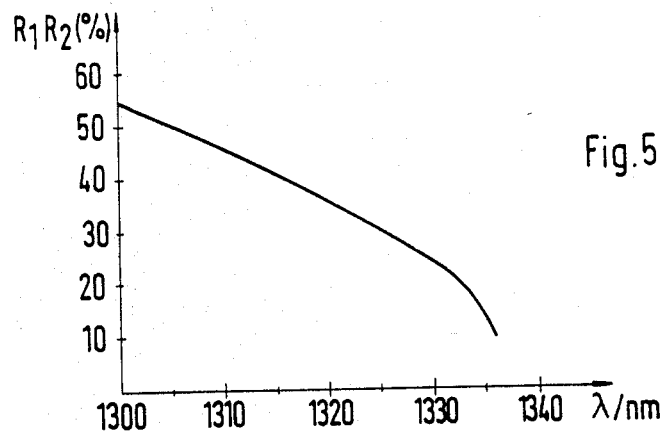
FIG. 5 is a plot of the product $R_1R_2$ versus wavelength for a temperature-independent optical power output.

In FIG. 5, $R_1R_2$ is plotted against the wavelength of the emitted radiation. This spectral dependence can be implemented with multilayer reflective coatings, for example.

The fundamental idea of the invention, namely to maintain the differential quantum efficiency or the power output constant by applying suitable reflective coatings to the laser, is not limited to the application and embodiment described. It can also be applied to any solid-state laser and to other laser types if the relationship between emission wavelength and temperature and the temperature dependence of the internal absorption coefficient were determined experimentally or are known.

We claim:

1. A semiconductor laser diode comprising a front surface having a reflection coefficient $R_1$ and a rear surface having a reflection coefficient $R_2$, wherein the values of $R_1$ and $R_2$ are wavelength dependent and the product $(R_1R_2)$ satisfies the relationship $$(R_1R_2)_T = \exp\left(-2.1\,\frac{\alpha_{int}(T)}{\alpha_{int}(T = 0°\,C.)}\right)$$

where
T = temperature at which $R_1 \cdot R_2$ is measured
$\alpha_{int}$ = internal absorption coefficient.

2. A semiconductor laser diode comprising:
a front surface having a multilayered coating including semi-reflective dielectric layers having wavelength-dependent reflection coefficients with various indices or refraction, and
a rear surface having a multilayered coating including semi-reflective dielectric layers having wavelength-dependent reflection coefficients with various indices of refraction, and wherein
the front surface coating layers are selected and applied in a sequence which provides that the reflection coefficient of the front surface decreases with an increase in the temperature of said front surface.

3. A semiconductor laser diode according to claim 2, wherein
the total reflective coefficient of the layer of said front surface is equal to $R_1$ and
the total reflective coefficient of the layer of said second surface is equal to $R_2$, wherein
the product $(R_1R_2)$ changes exponentially with respect to a change in temperature of the diode.

* * * * *